United States Patent
Bolandrina et al.

(10) Patent No.: US 11,810,609 B2
(45) Date of Patent: Nov. 7, 2023

(54) REFERENCE VOLTAGE MANAGEMENT

(71) Applicant: Micron Technology, Inc., Boise, ID (US)

(72) Inventors: Efrem Bolandrina, Alzano Lombardo (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/563,395

(22) Filed: Dec. 28, 2021

(65) Prior Publication Data
US 2022/0199140 A1 Jun. 23, 2022

Related U.S. Application Data

(63) Continuation of application No. 16/877,161, filed on May 18, 2020, now Pat. No. 11,217,293, which is a
(Continued)

(51) Int. Cl.
*G11C 11/00* (2006.01)
*G11C 11/22* (2006.01)

(52) U.S. Cl.
CPC ........ *G11C 11/2275* (2013.01); *G11C 11/221* (2013.01); *G11C 11/2259* (2013.01);
(Continued)

(58) Field of Classification Search
CPC ............. G11C 11/221; G11C 11/2273; G11C 11/2255; G11C 11/2275; G11C 11/2257;
(Continued)

(56) References Cited

U.S. PATENT DOCUMENTS 9,721,639 B1 * 8/2017 Calderoni ........... G06F 11/1068
10,163,481 B1 12/2018 Vimercati
(Continued)

FOREIGN PATENT DOCUMENTS

CN 102915763 A 2/2013
CN 109074837 A 12/2018
(Continued)

OTHER PUBLICATIONS

China Patent Office, "Office Action and Search Report," issued in connection with China Patent Application No. 202080031998.5 dated Mar. 15, 2022 (6 pages).
(Continued)

*Primary Examiner* — Thong Q Le
(74) *Attorney, Agent, or Firm* — Holland & Hart LLP

(57) ABSTRACT

Techniques are described for maintaining a stable voltage difference in a memory device, for example, during a critical operation (e.g., a sense operation). The voltage difference to be maintained may be a read voltage across a memory cell or a difference associated with a reference voltage, among other examples. A component (e.g., a local capacitor) may be coupled, before the operation, with a node biased to a first voltage (e.g., a global reference voltage) to sample a voltage difference between the first voltage and a second voltage while the circuitry is relatively quiet (e.g., not noisy). The component may be decoupled from the node before the operation such that a node of the component (e.g., a capacitor) may be allowed to float during the operation. The voltage difference across the component may remain stable during variations in the second voltage and may provide a stable voltage difference during the operation.

20 Claims, 12 Drawing Sheets

Related U.S. Application Data continuation of application No. 16/381,702, filed on Apr. 11, 2019, now Pat. No. 10,692,557.

(52) U.S. Cl.
CPC ...... *G11C 11/2273* (2013.01); *G11C 11/2255* (2013.01); *G11C 11/2257* (2013.01)

(58) Field of Classification Search
CPC ......... G11C 7/06; G11C 7/1006; G11C 29/52; G11C 7/04; G11C 11/2293; G11C 7/12; G11C 2207/063; G11C 2207/068; G11C 7/067; G11C 11/4091; G11C 11/4094; G11C 2207/002; G11C 7/02; G11C 7/062; G11C 7/065; G11C 7/08; G11C 11/00; G11C 11/16; G11C 11/22; G11C 11/223; G11C 11/5628; G11C 11/5642; G11C 11/5657; G11C 13/004; G11C 13/0061; G11C 16/0483; G11C 16/3427; G11C 2013/0054; G11C 11/14; G11C 11/5685; G11C 13/0002; G11C 13/0007; G11C 13/0038; G11C 13/0069; G11C 2013/0073; G11C 2013/009; G11C 2213/15; G11C 2213/34; G11C 2213/79; G11C 2213/82

See application file for complete search history.

(56) References Cited

U.S. PATENT DOCUMENTS

| | | |
|---|---|---|
| 10,692,557 B1 | 6/2020 | Bolandrina et al. |
| 2011/0058427 A1 | 3/2011 | Choi et al. |
| 2013/0051109 A1 | 2/2013 | Madan |
| 2015/0228351 A1 | 8/2015 | Wang et al. |
| 2017/0256300 A1 | 9/2017 | Vimercati et al. |
| 2018/0137906 A1 | 5/2018 | Vimercati et al. |

FOREIGN PATENT DOCUMENTS

| | | |
|---|---|---|
| JP | 2002-133857 A | 5/2002 |
| JP | 2012252758 A | 12/2012 |
| JP | 2018163711 A | 10/2018 |
| KR | 10-2007-0037055 A | 4/2007 |
| KR | 20160038160 A | 4/2016 |
| WO | 2017/156444 A1 | 9/2017 |

OTHER PUBLICATIONS

Japan Patent Office, "Decision to Grant a Patent", issued in connection with Japan Patent Application No. 2021-559731, dated Mar. 8, 2022 (5 pages).

ISA/KR, International Search Report and Written Opinion of the International Searching Authority, Int'l. Appl. No. PCT/US2020/023324, dated Jul. 14, 2020, Korean Intellectual Property Office, Seo-gu, Daejeon, Republic of Korea, 11 pgs.

European Patent Office, "Supplementary European Search report and Search Opinion," issued in connection with European Patent Application No. 20788525.2 dated Dec. 8, 2022 8 pages.

\* cited by examiner

REFERENCE VOLTAGE MANAGEMENT

CROSS REFERENCE

The present application for patent is a continuation of U.S. patent application Ser. No. 16/877,161 by Bolandrina et al., entitled "REFERENCE VOLTAGE MANAGEMENT", filed May 18, 2020, which is a continuation of U.S. patent application Ser. No. 16/381,702 by Bolandrina et al., entitled "REFERENCE VOLTAGE MANAGEMENT", filed Apr. 11, 2019, each of which is assigned to the assignee hereof and each of which is expressly incorporated by reference in its entirety herein.

BACKGROUND

The following relates generally to a system that may include at least one memory device and more specifically to apparatus and techniques for reference voltage management in a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
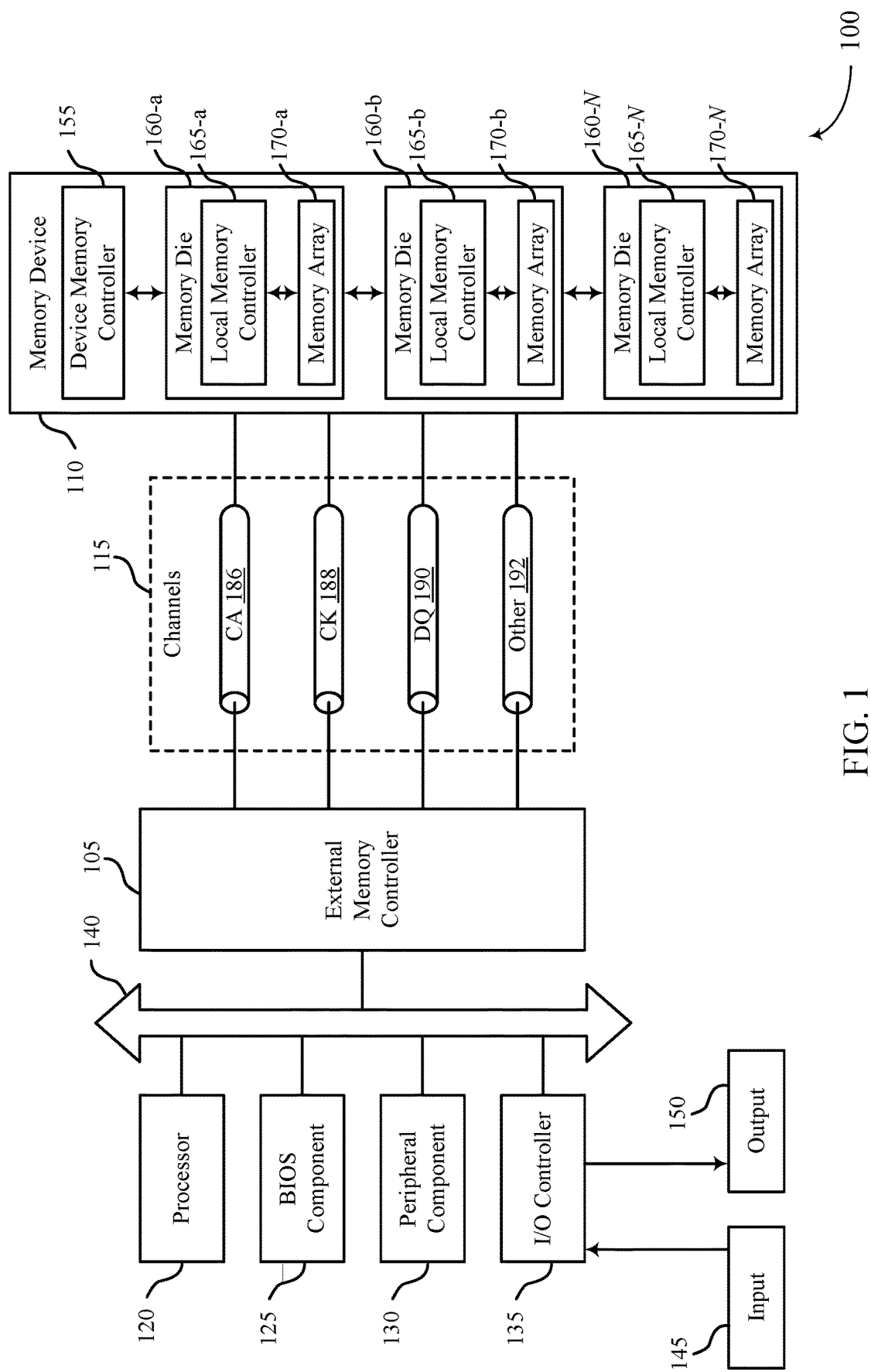
FIG. 1 illustrates an example of a system that supports reference voltage management in a memory device in accordance with examples as disclosed herein.

The performance of a sense component (e.g., a sense amplifier) in a memory device may be affected by a power delivery network (PDN) capability, such as a noise rejection capability. For example, depending on the read path and the sense architecture, the accuracy of a sense operation may be affected by noise associated with voltages used for biasing a memory cell (e.g., read voltages) or for determining a state stored on a memory cell (e.g., reference voltages). Improved techniques for reference voltage management are desired.

A memory device may include a memory cell and a sense component. The sense component may be coupled with a digit line associated with the memory cell and may be used to sense a state stored by the memory cell during a read operation. Some types of memory cells, such as ferroelectric memory cells, may include a cell capacitor for storing the state of the memory cell. During an operation, such as a read operation, the memory cell may be biased by applying a voltage to one or both plates of the cell capacitor, which may cause the cell capacitor to share electric charge with the digit line during a read operation. The resulting amount of charge on the digit line (or the corresponding voltage or current) may be used by the sense component to determine the state stored by the memory cell, such as by comparing the voltage of the digit line with a reference voltage that may be defined in terms of a voltage difference between a voltage of a reference line and a ground voltage, for example.

In some cases, the voltage (e.g., the read voltage) across the memory cell (e.g., the difference between the voltages applied to the top and bottom plates of the cell capacitor) or the voltage difference associated with the reference voltage may be affected by noise within the PDN. For example, a voltage applied to one plate of a capacitor in a memory cell may change during a read operation due to parasitic capacitance or electrical coupling within the PDN. In this case, the voltage across the cell capacitor may also change; e.g., the read voltage may not be stable, which may affect the amount of charge shared by the memory cell with the digit line during the read operation.

In some cases, if the read voltage is not sufficiently well controlled (e.g., stable) during portions, such as critical portions, of the read operation (e.g., when the sense component is activated and sensing the voltage or current on the digit line), the sense component may not be able to accurately determine the state stored by the memory cell. Similarly, the accuracy of the sense operation may be adversely affected if the voltage difference between a reference voltage and another voltage (such as a ground voltage) is not sufficiently well controlled (e.g., stable) during the sense operation. Thus, it may be desirable to identify techniques for managing (e.g., controlling) such voltage differences during a read operation.

In some cases, the digit line of a memory cell may be coupled with the sense component via a cascode amplifier (or other type of switching component). For example, the cascode may establish a conductive path between the digit line and the sense component. In this case, the read voltage of the memory cell (e.g., the voltage across the cell capacitor) may be affected by the voltage at a gate of the cascode.

In some cases, the gate voltage may be provided by one or more components, such as peripheral regulators, and may be stabilized (e.g., maintained) using other components, such as global capacitors in various places on the chip. Thus, the gate voltage may be relatively stable. The plate line voltage (e.g., the voltage applied to the other plate of the cell capacitor), however, may be provided by plate line drivers, and may be affected by electrical current injected into the circuitry from other components in the memory device. For example, when the sense component is activated during a read operation it may inject current into the plate line and change the voltage of the plate line—thereby changing the read voltage across the memory cell because the gate voltage is not similarly affected. A change in the read voltage across the memory cell due to current injection from an activated sense component may be particularly problematic because it occurs at a critical time in the read operation, when the sense component is attempting to determine the state of the memory cell. Similarly, a reference voltage may be affected by current injected into the circuit during a read operation.

Thus, in some cases, a memory device may include a component, such as a local capacitor, to help maintain a stable read voltage during a read operation. For example, one node of the local capacitor may be coupled with the plate line voltage, and a second node of the local capacitor may be coupled with the gate of the cascode. Before the sense component is activated during a read operation, the second node of the local capacitor may also be coupled with a node biased to the gate voltage and may thereby sample and store a voltage difference between the plate line voltage and the gate voltage while the sense component is idle and the circuitry is relatively quiet (e.g., not noisy).

During the critical portion of the read operation (e.g., when the sense component is activated to sense the state of the memory cell), the local capacitor may be decoupled from the gate voltage and may be allowed to float. In this case, changes to the plate line voltage (e.g., due to activation of the sense component) may correspondingly change the voltage at the gate of the transistor by way of the local capacitor, thereby causing the voltage at the gate of the cascode to track the plate line voltage and maintain a stable read voltage across the memory cell while the sense component is activated. Similar techniques may be used to maintain stability of a reference voltage during one or more operations, such as critical operations.

In some cases, multiple local capacitors may be used to sample the difference between the plate line voltage and the gate voltage at different times before the sense component is activated. This set of local capacitors may be used to provide one or more measurements over time, for example an average or a moving average, of the voltage difference to the gate of the transistor, as described in more detail herein.

In some cases, the techniques described herein may reduce or eliminate the need for local repeaters to maintain stable voltage differences during critical operations, and may help compensate for higher voltage drops across the PDN. While these techniques are discussed primarily in the context of maintaining a stable read voltage or reference voltage, a similar approach may be used to stabilize various other performance characteristics, including but not limited to voltage differences, in a memory device.

Features of the disclosure are initially described in the context of a memory system and memory arrays. Features of the disclosure are described in the context of hysteresis curves that support reference voltage management. These and other features of the disclosure are further illustrated by and described with reference to memory devices, circuits, timing diagrams, and flowcharts that relate to reference voltage management.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include features of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that may include a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105.

For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

In the disclosed technology, the local memory controller 165 (e.g., local to a memory die 160) may cause the memory device 100 to perform operations specific to maintaining a stable read voltage during a read operation of a memory cell. Specifically, the local memory controller 165 may cause the memory device 100 to couple a local capacitor with a first node biased to a first voltage. The first capacitor may also be coupled with a second node associated with establishing a conductive path between a digit line (e.g., a digit line 215) of a memory cell and a sense component (e.g., a sense component 250). The memory device 100 may store a voltage difference between the first voltage and a second voltage associated with a plate line of the memory cell using the local capacitor. The memory device 100 may decouple the local capacitor from the first node and access the memory cell after decoupling the local capacitor from the first node. During the access operation, the local capacitor helps to stabilize the read voltage. The memory device 100 may re-couple the first capacitor with the first node after accessing the memory cell.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any number of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that may include at least three levels to encode more than one bit of information. Multi-symbol modulation schemes and symbols may alternatively be referred to as non-binary, multi-bit, or higher-order modulation schemes and symbols.

Figure 2:
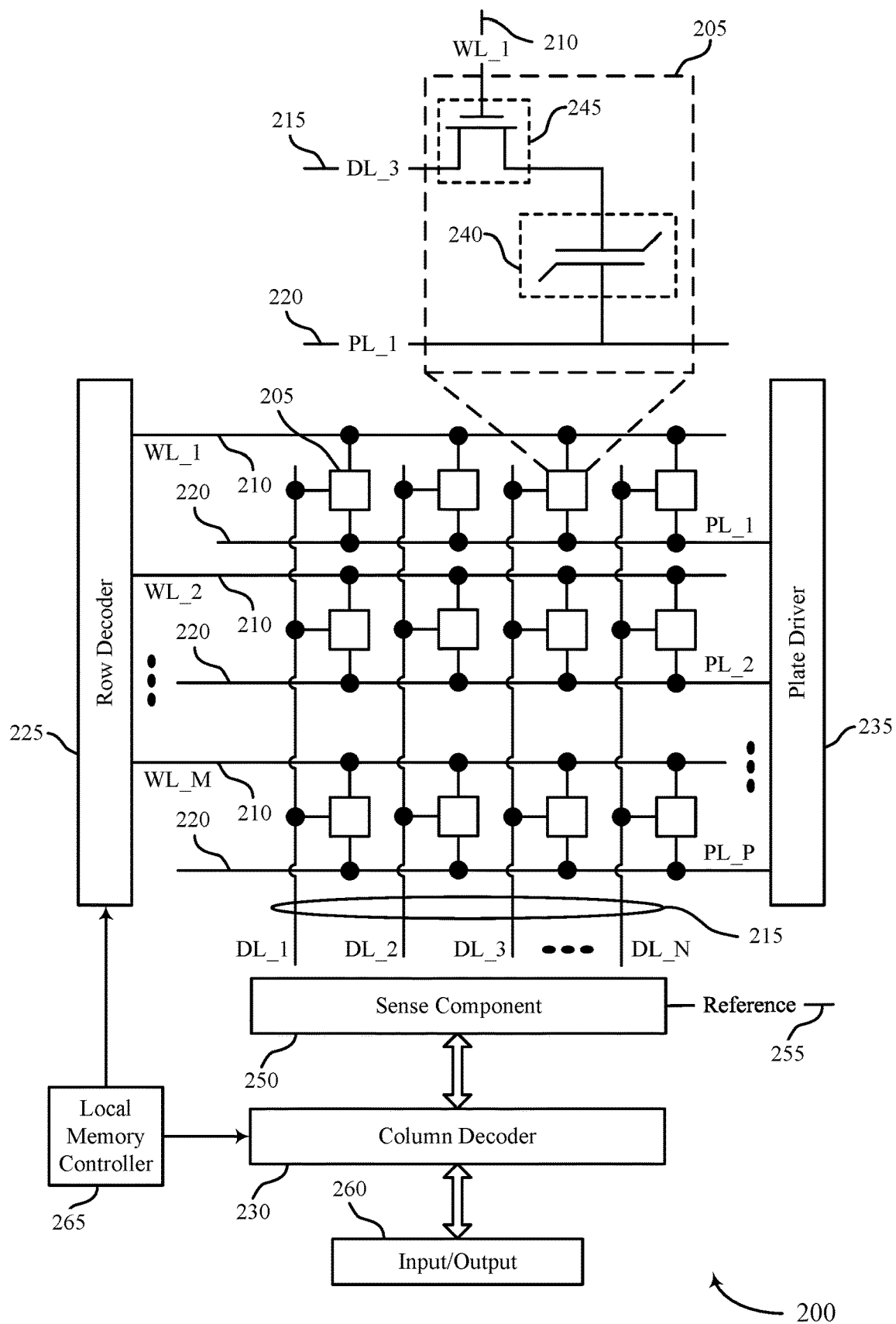
FIG. 2 illustrates an example of a memory array that supports reference voltage management in a memory device in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that may include a ferroelectric material to store a charge and/or a polarization representative of the programmable state. In DRAM architectures, the memory cell 205 may include a capacitor that may include a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205. In some cases, it may be beneficial to manage or control the voltages of the plate line 220 and the digit line 215 (or other voltages that may affect the voltage of the digit line 215) to provide a stable read voltage across capacitor 240 during a read operation.

The sense component 250 may be configured to detect a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. In some cases, the sense component 250 may include or may be coupled with a cascode amplifier that couples the digit line 215 with the sense amplifiers. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change.

The sense component 250 may be configured to compare the signal received from the memory cell 205 across the digit line 215 to a reference signal 255 (e.g., a reference voltage). The sense component 250 may determine the stored state of the memory cell 205 based on the comparison.

For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of memory cell 205 may be output through column decoder 230 as output 260. In some cases, the sense component 250 may be part of another component (e.g., a column decoder 230, row decoder 225). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may include precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205).

The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205).

The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some cases, a memory cell 205 may be coupled with a digit line 215, a switching component for coupling the digit line 215 with a sense component 250, and a first capacitor having a first node coupled with the switching component. The first capacitor with the first node may be biased to a first voltage. A first voltage supply, which supplies the first voltage, may be coupled with a plate line of the memory cell 205 and with a second node of the first capacitor. The memory die 200 may also include a controller that causes the memory die 200 to couple the first node of the first capacitor with a third node that is biased to a second voltage to store a voltage different between the second voltage and the first voltage with using the first capacitor. The controller can decouple the first capacitor from the third node and access the memory cell 205 after decoupling the first capacitor from the third node. Accessing the memory cell 205 may include performing a critical operation (e.g., a read operation). After accessing the memory cell 205, the first capacitor may be re-coupled with the third node after accessing the memory cell 205.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3A:
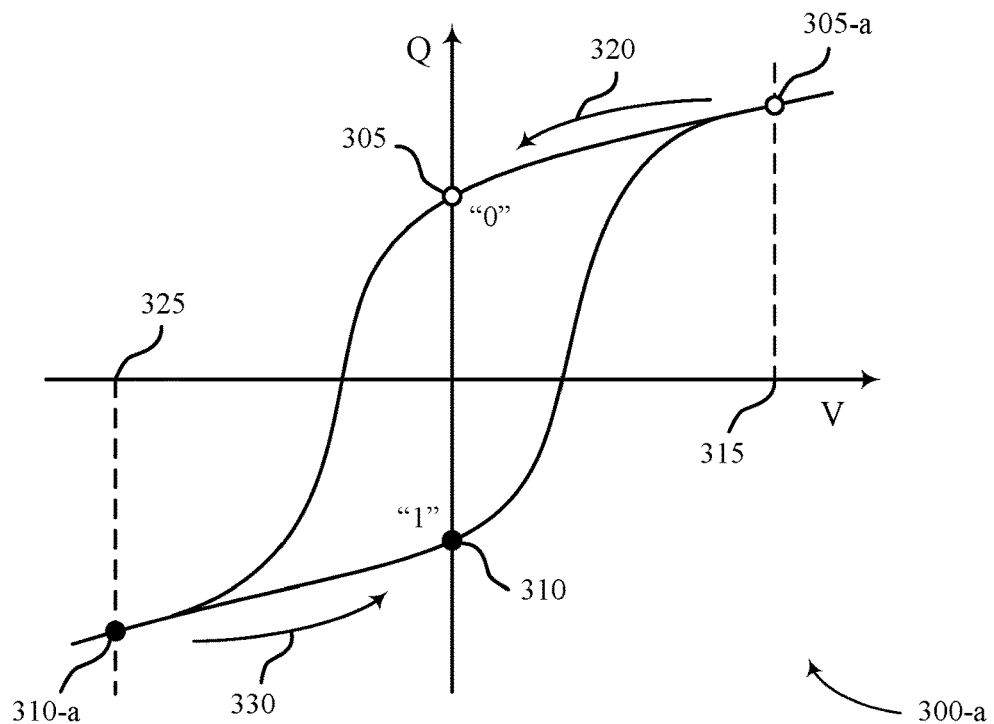
FIGS. 3A and 3B illustrate examples of hysteresis curves that support reference voltage management in a memory device in accordance with examples as disclosed herein.
Figure 3B:
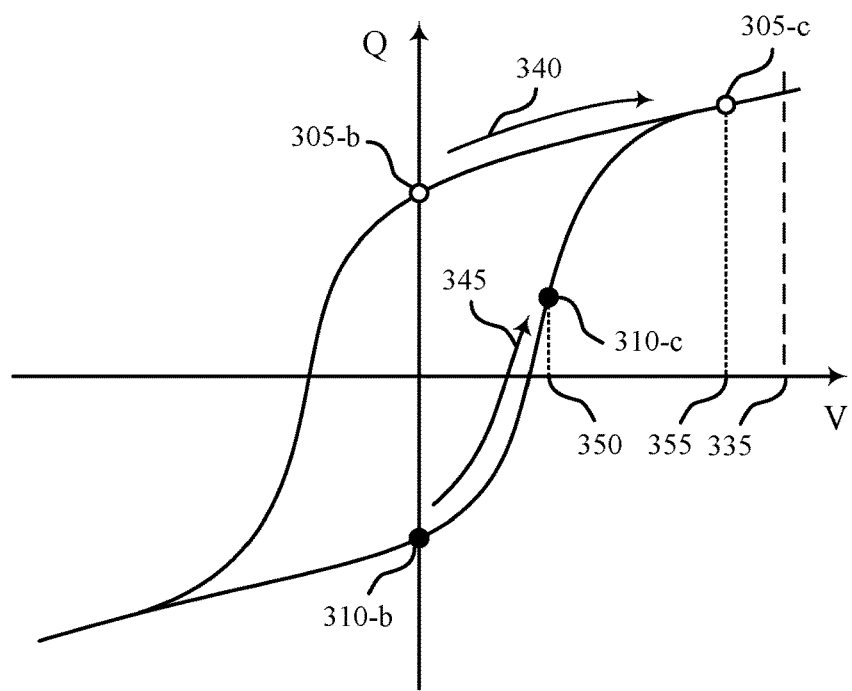

FIGS. 3A and 3B illustrates examples of non-linear electrical properties of a ferroelectric memory cell with hysteresis curves 300-*a* and 300-*b*, respectively, in accordance with various examples of the present disclosure. Hysteresis curves 300-*a* and 300-*b* illustrate an example ferroelectric memory cell writing and reading process, respectively. Hysteresis curves 300-*a* and 300-*b* depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-*a* and 300-*b* represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—e.g., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero-voltage difference, resulting in two possible charged states: a charge state 305 and a charge state 310. According to the example of FIG. 3A, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. As shown in FIG. 3A, upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, e.g., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—e.g., the final stored charge (Q) depends on whether charge state 305-*b* or 310-*b* was initially stored. For example, as shown in FIG. 3B, hysteresis curve 300-*b* illustrates two possible stored charge states 305-*b* and 310-*b*. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on one or more factors, including the specific sensing scheme and circuitry.

The voltage applied across the capacitor of the memory cell during a read operation may be referred to as a read voltage, and the accuracy of the read operation may depend in part on the stability of the read voltage; e.g., on the stability of the voltages applied to the cell plate (e.g., via a plate line) and the cell bottom (e.g., via a digit line) of the capacitor. In some cases, a (separate) local capacitor may be used to maintain a stable read voltage across the cell capacitor during a read operation, as described herein.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—e.g., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—e.g., the difference between the voltage 335 and the voltage 350 or the different between the voltage 335 and the voltage 355. A reference voltage may be generated such that its magnitude is between the two possible voltages of the two possible digit line voltages to determine the stored logic state—e.g., if the digit line voltage is higher or lower than the reference voltage. Upon comparison by the sense component, the sensed digit line voltage may be determined to be higher or lower than the reference voltage, and the stored logic value of the ferroelectric memory cell (e.g., a logic 0 or 1) may be determined.

In some cases, a ferroelectric memory cell may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction. In some cases, a ferroelectric memory cell may lose its initial logic state after a read operation. For example, if charge state 310-*b* is stored, the charge state may follow path 345 to charge state 305-*c* during a read operation and, after removing voltage 335, the charge state may relax to the charge state 305-*b* by following path 340.

Hysteresis curve 300-*b* illustrates an example of reading a memory cell that is configured to store the charge state 305-*b* and the charge state 310-*b*. A read voltage 335 may be applied, for example, as a voltage difference via a digit line 215 and a plate line 220 as described with reference to FIG. 2. Hysteresis curve 300-*b* may illustrate read operations where the read voltage 335 is negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-a (e.g., a logic 1) or at charge state 310-a (e.g., a logic 0).

Figure 4:
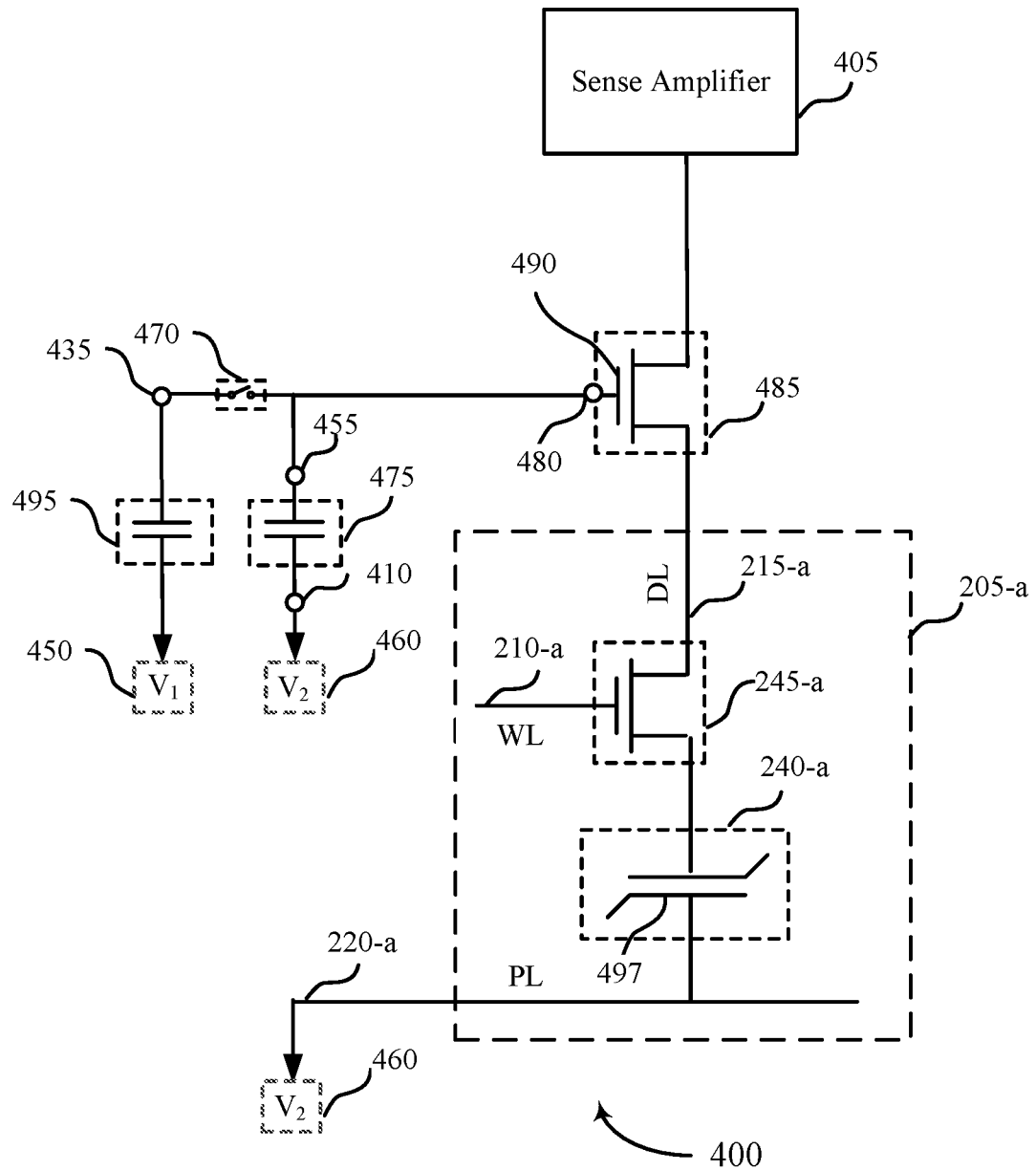
FIG. 4 illustrates an example of a memory device that supports reference voltage management in accordance with examples as disclosed herein.

FIG. 4 illustrates an example of a memory device 400 that supports reference voltage management in accordance with examples as disclosed herein. The memory device 400 may include a memory cell 205-a that may be coupled with a digit line (DL) 215-a. Memory cell 205-a may include a cell capacitor 240-a, such as a ferroelectric capacitor or another type of capacitor, for example. Memory cell 205-a may include a cell selector 245-a (e.g., a switching component) for selecting memory cell 205-a by activating a signal on word line (WL) 210-a. Memory cell 205-a, word line 210-a, and digit line 215-a may be examples of memory cell 205, word line 210, and digit line 215 as discussed with reference to FIG. 2.

A cell plate 497 of cell capacitor 240-a may be coupled with a plate line 220-a. Plate line 220-a may be coupled with voltage source 460, which may supply a plate line voltage Vplate to plate line 220-a. In some cases, Vplate may be set to a VSS voltage, for example, which may be a ground voltage. In some cases, Vplate may be set to another voltage.

The digit line 215-a may be coupled with a sense amplifier 405 via switching component 485. That is, switching component 485 may be used to establish a conductive path between digit line 215-a and sense amplifier 405. In some cases, switching component 485 may be a cascode amplifier or another type of switching component that may include one or more transistors. In some cases, sense amplifier 405 may be part of a sense component, such as sense component 250 described with reference to FIG. 2, and may be used to sense a logic state stored on memory cell 205-a by sensing a voltage, current, or charge on digit line 215-a.

Memory device 400 may include a local capacitor 475. A first node 455 of local capacitor 475 is coupled with a switching component 470 and with node 480, which may be a node associated with a gate 490 of switching component 485. A second node of local capacitor 475 is coupled with voltage source 460, which may supply the plate line voltage Vplate. That is, in some cases, the second node 410 of local capacitor 475 may be biased to the plate line voltage.

In some cases, Vplate as seen by the plate line 220-a and the second node 410 of local capacitor 475 may vary relative to the actual voltage supplied by voltage source 460, due to transient effects in memory device 400. That is, Vplate at plate line 220-a and the second node 410 of local capacitor 475 may be a local Vplate that may not be fully stable.

In some cases, a voltage at node 480 may activate switching component 485 to couple digit line 215-a with sense amplifier 405. The switching component 485 (e.g., a transistor of the switching component) may be associated with a threshold voltage, Vth, which may cause a voltage difference between the voltage at the gate 490 of the switching component 485 and the voltage of the digit line 215-a. In some cases, Vth may be a minimum voltage for activating switching component 485, for example, and may represent a voltage difference from a gate of switching component 485 to a source of switching component 485.

Thus, in some cases, the voltage on the digit line 215-a—and therefore, the voltage on the cell bottom of capacitor 240-a—may be approximately equal to the voltage at node 480 (e.g., the gate voltage) minus the threshold voltage Vth. Because of this relationship, the voltage at the gate 490 of the switching component 485 (e.g., at node 480) may be used to bias memory cell 205-a.

Local capacitor 475 may be selectively coupled with node 435 by activating switching component 470. Node 435 may be biased to a voltage supplied by voltage source 450; e.g., via global capacitor 495. The voltage at node 435 may, in some cases, be referred to as a VCASC voltage (e.g., a voltage for biasing a cascode amplifier). Global capacitor 495 may be included in memory device 400 to help maintain the stability of the VCASC voltage at node 435, for example. In some cases, global capacitor 495 may represent a single discrete capacitor. In other cases, global capacitor 495 may represent one or more discrete capacitors along with parasitic capacitance associated with the circuitry in memory device 400.

When switching component 470 is activated, local capacitor 475 may develop a voltage across local capacitor 475 that is based on the voltage of node 435 (e.g., the VCASC voltage) and the voltage provided by voltage source 460 (e.g., Vplate). That is, while switching component 470 is activated, local capacitor 475 may develop a voltage difference across local capacitor 475 that is equal to VCASC−Vplate.

The first node 455 of the local capacitor 475 may be coupled with node 435 (which is biased to VCASC) at a time while the sense component is idle. This may cause local capacitor 475 to store the voltage difference between the voltage at node 435 (VCASC) and the plate line voltage (Vplate) while the circuitry is relatively quiet. During this period, the voltage at node 480 may be substantially equivalent to the voltage at node 435.

As previously discussed, a read operation may include activating a sense component (e.g., including sense amplifier 405) to determine the state stored by memory cell 205-a. Before the sense amplifier 405 is activated, however, the first node of the local capacitor 475 may be decoupled from node 435 by deactivating switching component 470, allowing the first node 455 of local capacitor 475 (and node 480 associated with gate 490) to float. At this point, the voltage at node 480 may be referred to as a local VCASC voltage, because it is based on the (global) VCASC voltage at node 435 but is allowed to drift based on voltage changes in Vplate at node 410. After switching component 470 is deactivated, memory cell 205-a may be accessed and sense amplifier 405 may be activated to determine the state stored by memory cell 205-a.

As previously noted, when the sense component (e.g., including sense amplifier 405) is activated, it may inject current into the plate line 220-a, causing the plate line voltage (Vplate) to change. Thus, the plate line voltage at the second node 410 of the local capacitor 475 may change during the read operation. Because first node 455 of capacitor 475 is floating (e.g., it is not controlled or coupled with a voltage supply), a change in the plate line voltage at the second node 410 of local capacitor 475 results in a corresponding change in the voltage at the first node 455 of the local capacitor 475, thereby also changing the voltage at node 480. In this manner, local capacitor 475 allows the local VCASC voltage at node 480 (at the gate 490 of the switching component 485) to track voltage changes in the plate line voltage Vplate, thereby maintaining a stable voltage difference (e.g., read voltage) across memory cell 205-*a* during the critical portions of the read operation, such as when the sense amplifier 405 is activated.

After the sense portion of the read operation is completed, the sense amplifier 405 may be deactivated (e.g., the sense amplifier 405 may become idle), and the first node 455 of the local capacitor 475 may be re-coupled with node 435 to recharge local capacitor 475 to the voltage difference between node 435 (e.g., VCASC) and node 410 (e.g., Vplate) before then next access of the memory cell 205-*a*.

In some cases, switching component 470 may be deactivated by opening switching component 470 such that there may be no electrical connection between node 435 and first node 455 (and node 480). In this case, when switching component 470 is deactivated, the resistance of switching component 470 may be considered to be infinite.

In some cases, switching component 470 may be deactivated by adjusting (e.g., increasing) the resistance of switching component 470, without fully opening switching component 470. For example, an open switching component may be replaced with a resistive connection to keep a weak connection between the global VCASC voltage (at node 435) and the local VCASC voltage (at node 480). In this case, a small amount of current may still flow through switching component 470.

Figure 5:
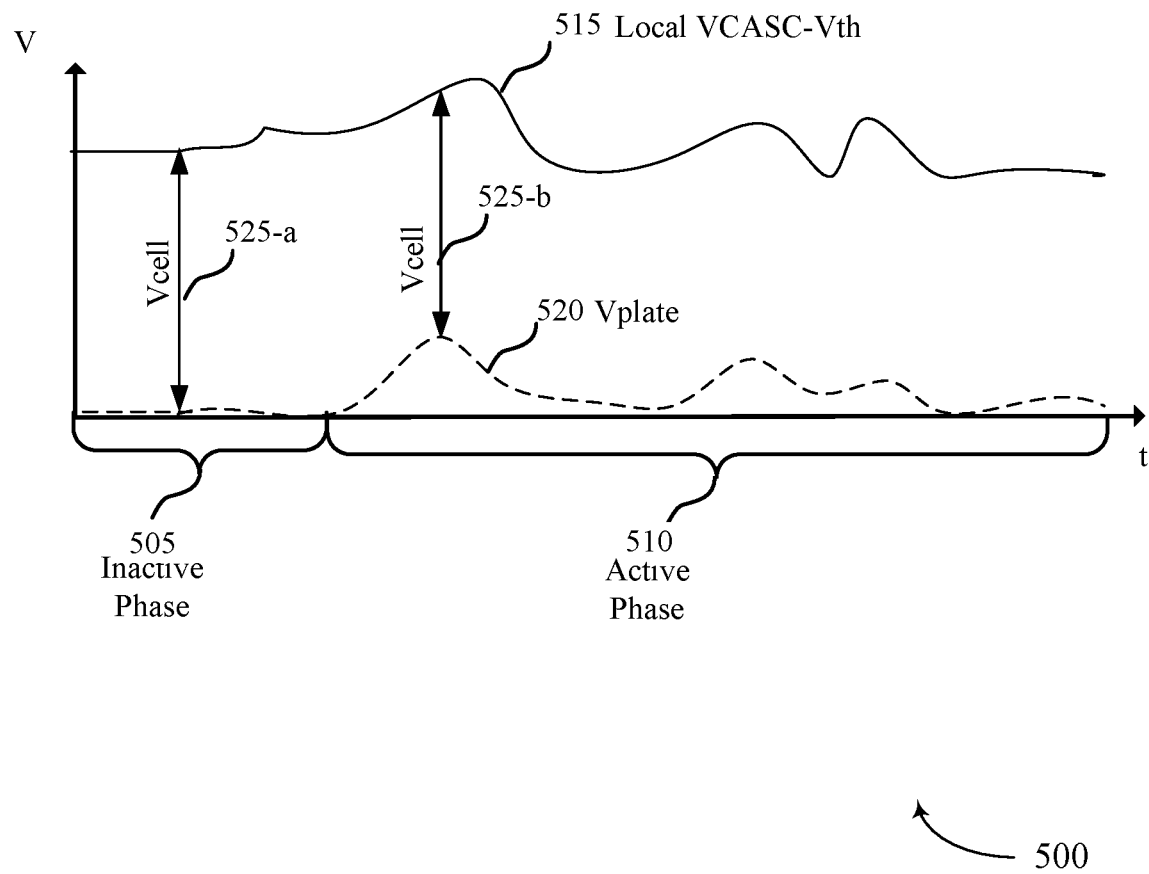
FIG. 5 illustrates a timing diagram of memory cell voltages in a system that supports reference voltage management in accordance with examples as disclosed herein.

FIG. 5 illustrates an example of a timing diagram 500 of voltages that may occur during a read operation of a memory cell in a memory device that supports reference voltage management in accordance with examples as disclosed herein.

As previously discussed, in some cases, the read voltage across a memory cell (e.g., the difference between the voltages applied to the top and bottom plates of the cell capacitor) may be affected by noise within the PDN. The read voltage may be expressed as:

$$V\text{cell}=\text{VCASC}-V_{th}-V\text{plate}$$

where VCASC may be the local VCASC voltage at node 480; e.g., at the gate 490 of switching component 485 (e.g., a transistor or cascode amplifier). Vth may be a threshold voltage associated with switching component 485, and Vplate may be the plate voltage applied to the cell plate of cell capacitor 240-*a*.

As previously discussed, it may be desirable to maintain a stable read voltage Vcell during a read operation of a memory cell 205-*a*, particularly during the critical portion of the read operation in which the sense amplifier (e.g., sense amplifier 405) is activated and is determining the state stored by the memory cell 205-*a*. However, in some cases, when the sense amplifier is activated, it may cause the voltage of the plate line (Vplate) to rise, thus potentially reducing the read voltage Vcell, which may adversely affect the accuracy of the read operation.

Thus, as discussed with reference to FIG. 4, a local capacitor 475 may be used to maintain a stable read voltage Vcell during the read operation. In particular, local capacitor 475 may be coupled with node 435 that may be biased to a voltage (e.g., VCASC). The local capacitor 475 may be coupled with node 435 during an inactive phase 505 (e.g., while the sense amplifier is inactive) to sample and store a voltage difference between Vplate and VCASC while the circuitry is relatively quiet. Switching component 470 may then be deactivated before the sense amplifier is activated to decouple local capacitor 475 from node 435 and allow node 480 to float at a voltage that is based on the voltage across local capacitor 475. Because the first node 455 of local capacitor 475 is floating and the second node 410 of local capacitor 475 is coupled with Vplate, the voltage at node 480 may track changes in the voltage of Vplate, thereby maintaining a stable read voltage Vcell during an active phase 510 during which the critical operation is performed, as depicted in timing diagram 500.

That is, as depicted in FIG. 5, when the plate line voltage Vplate rises during the active phase 510 (e.g., due to the activation of the sense amplifier to sense the state of the memory cell), the local VCASC at node 480 (and therefore, local VCASC–Vth) rises by a commensurate amount, thereby maintaining a stable read voltage Vcell across memory cell 205-*a* during the active phase 510. The voltages depicted in timing diagram 500 are approximate and are intended to illustrate general behaviors rather than specific voltages.

Figure 6:
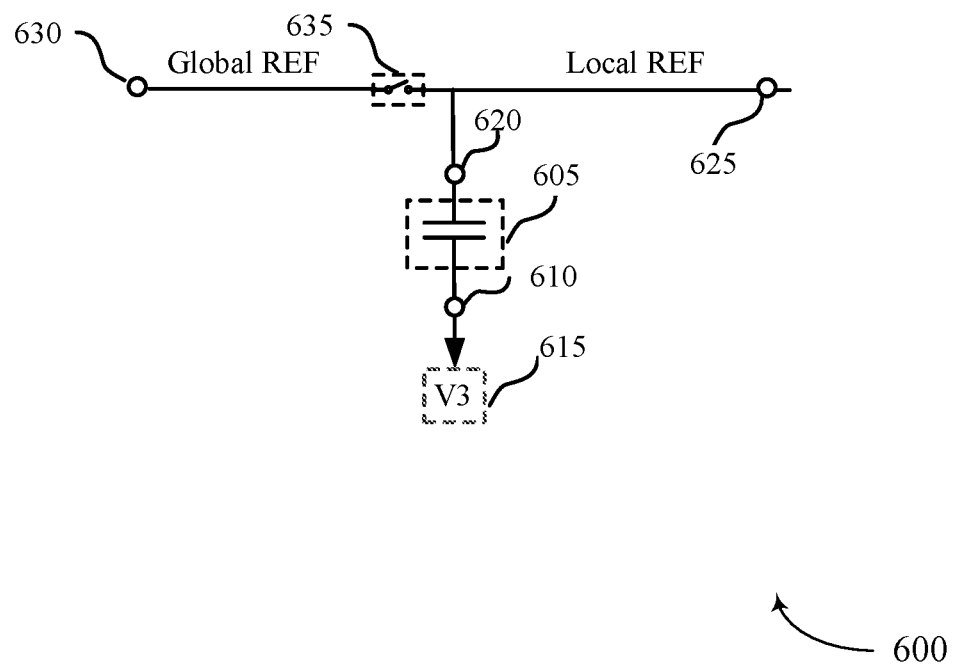
FIG. 6 illustrates an example of a circuit that supports reference voltage management in accordance with examples as disclosed herein.

FIG. 6 illustrates an example of a circuit 600 that supports reference voltage management in accordance with examples as disclosed herein. Circuit 600 may be similar to circuitry depicted in memory device 400, but may be used in the more general case of maintaining a stable voltage difference between a general reference signal and another voltage, such as a VSS voltage or ground voltage. Such a voltage difference may be used, for example, as a reference voltage used by a sense amplifier to determine a state stored by a memory cell as described with reference to FIG. 2, or may be used for another type of reference.

Circuit 600 may include a local capacitor 605 having a first node 610 coupled with a voltage source 615. Voltage source 615 may supply a first voltage, for example. The first voltage may be a VSS voltage, a ground voltage, or another voltage. Local capacitor 605 has a second node 620 that is coupled with node 625. Node 625 may be a node that provides a local reference voltage (Local REF) to other circuitry, such as to a sense component, for example.

The second node 620 of local capacitor 605 may be selectively coupled with node 630 by activating switching component 635, for example. Node 630 may be biased to a global reference voltage (Global REF).

Circuit 600 may be used within a memory device to provide a stable voltage difference between a local reference voltage at node 625 and a voltage supplied by voltage source 615 during certain critical operations of a memory device, for example. Such critical operations may include a portion of a read operation during which the local reference voltage is used to determine a state of a memory cell, or during another type of operation in which it may be desirable to maintain a stable voltage difference between the local reference voltage and the voltage supplied by voltage source 615.

In some cases, switching component 635 may be activated (e.g., during an inactive or idle phase when certain components, such as a sense component, of a memory device are inactive) to couple node 620 of local capacitor 605 with node 630. Switching component 635 may be activated before a critical operation, such as before the sense component is activated and uses the local reference voltage at node 625 to determine a state stored by the memory cell, for example. Switching component 635 may then be deactivated to store the voltage difference between node 630 and node 610 on local capacitor 605. The critical operation (e.g., a sense operation during an access of memory cell 205-*a*, or another type of operation) may then be performed while switching component 635 is deactivated and node 625 is floating. In some cases, switching component 635 may be activated again after the critical operation is completed to recharge capacitor 605 before a subsequent memory access.

Figure 7:
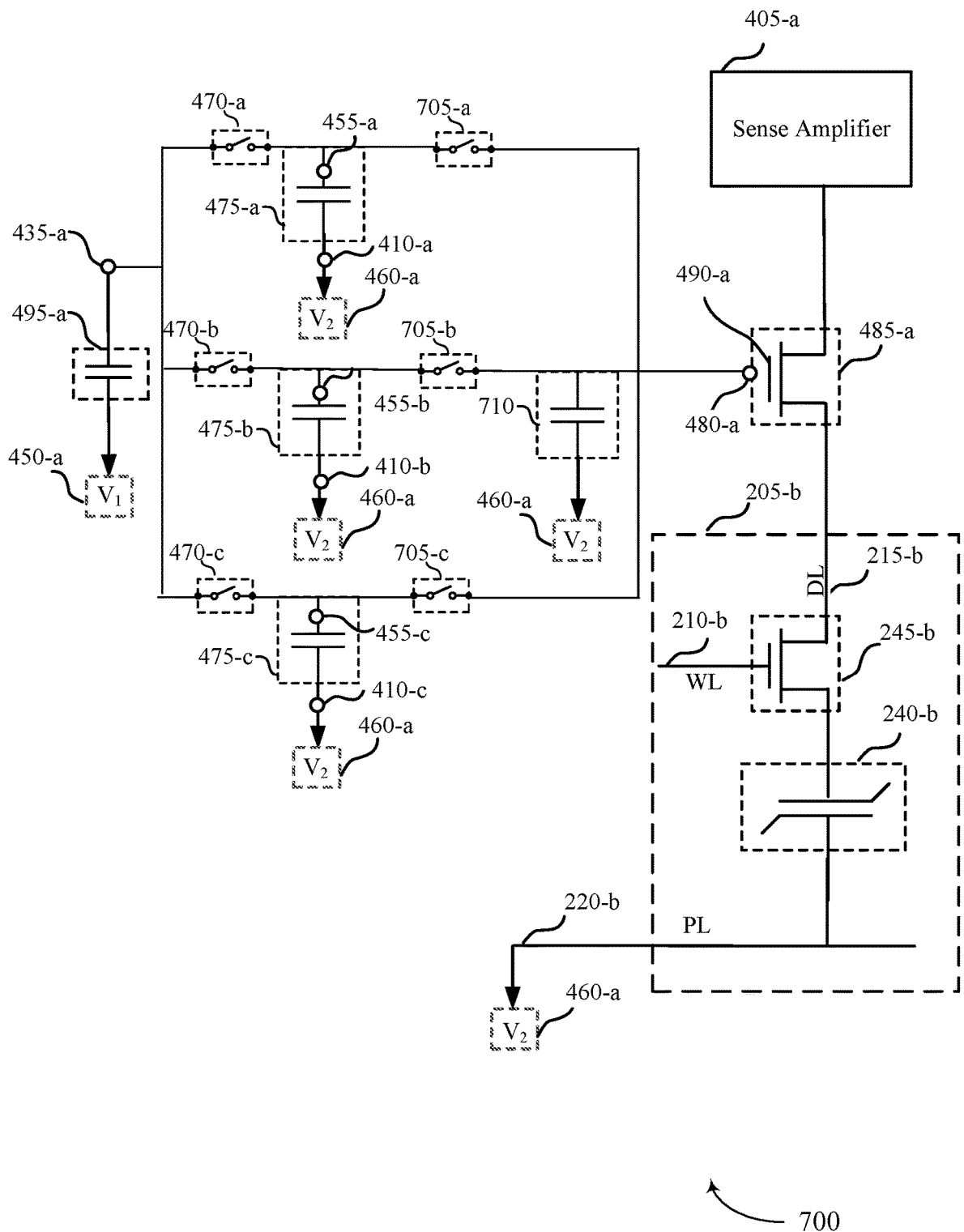
FIG. 7 illustrates an example of a memory device that supports reference voltage management in accordance with examples as disclosed herein.

FIG. 7 illustrates an example of a memory device 700 that supports reference voltage management in accordance with examples as disclosed herein. In some cases, the circuitry depicted in memory device 700 may help to provide a stable read voltage by sampling and storing a difference between, for example, a plate line voltage Vplate and a global cascode voltage VCASC at multiple times before a critical operation (e.g., when the sense amplifier is activated) using multiple local capacitors 475 and switching components 470. The multiple samples of the voltage difference may then be used to determine (e.g., provide) a moving average voltage difference.

In some cases, there may be transient noise in a circuit (e.g., in the PDN) at the time when the difference between a plate line voltage Vplate and a cascode voltage VCASC is stored; e.g., at the time when a switching component 470 is opened to cause local capacitor 475 to store a voltage difference as described with reference to FIG. 4. In this case, the voltage difference stored on a local capacitor 475 may be different than the voltage difference between Vplate and VCASC closer to the time at which the sense amplifier is activated, thereby potentially degrading the subsequent tracking of the local VCASC voltage with Vplate voltage when the switching component is opened. In this case, the read voltage (e.g., Vcell) during the critical operation may be less stable due to the transient voltage differences that occurred prior to the time at which the switching component 470 is deactivated.

Thus, instead of using a single local capacitor 475 sampled at a given time as described with reference to FIG. 4, a memory device 700 may include multiple local capacitors 475-a, 475-b, 475-c and corresponding switching components 470-a, 470-b, 470-c that may be used to store the voltage difference between VCASC and Vplate at multiple (different) times before the critical operation (e.g., when the sense amplifier is activated) as depicted in FIG. 7. The multiple local capacitors 475 may then be coupled with each other via switching components 705-a, 705-b, 705-c to enable charge sharing across the local capacitors 475, thereby providing a moving average of the difference between, for example, VCASC and Vplate. The moving average may, in turn, enable the memory device 700 to provide a more stable read voltage during the critical operation, as described in more detail below.

Memory device 700 may include a memory cell 205-b that may be coupled with a digit line (DL) 215-b. Memory cell 205-a may include a cell capacitor 240-b and a cell selector 245-b for selecting memory cell 205-b by activating a signal on word line (WL) 210-b. Memory cell 205-b, word line 210-b, and digit line 215-b may be examples of memory cell 205, 205-a, word line 210, 210-a, and digit line 215, 215-a as discussed with reference to FIGS. 2 and 4.

A cell plate of cell capacitor 240-b may be coupled with a plate line 220-b. Plate line 220-b may be coupled with voltage source 460-a, which may supply a plate line voltage Vplate to plate line 220-a.

The digit line 215-b may be coupled with sense amplifier 405-a via one or more switching components (e.g., switching component 485-a). That is, switching component 485-a may be used to establish a conductive path between digit line 215-b and sense amplifier 405-a. Switching component 485-a may be an example of switching component 485 as described with reference to FIG. 4, and may be a cascode amplifier, for example.

As discussed above, memory device 700 may include multiple local capacitors 475. The multiple local capacitors 475 may be used to sample the difference between the plate line voltage Vplate and the global VCASC voltage at different times before the sense amplifier 405-a is activated. This set of local capacitors 475 may be used to provide a moving average voltage to node 480-a, which may be located at a gate 490-a of switching component 485-a.

Each local capacitor 475 may be selectively coupled with node 435-a (e.g., with the global VCASC voltage) by activating a corresponding switching component 470. Node 435-a may be biased to a voltage provided by voltage source 450-a via global capacitor 495-a, for example. In some cases, node 435-a may be biased to a global VCASC voltage. By way of example, in some cases, a first capacitor 475-a and a second capacitor 475-b may be coupled with node 435-a by activating switching components 470-a and 470-b, respectively.

In some cases, a first node 455 of each local capacitor 475 may be selectively coupled with node 435-a as described above, and a second node 410 of each local capacitor 475 may be coupled with a plate line voltage Vplate provided by voltage source 460-a, for example. In some cases, the plate line voltage Vplate may also be applied to a bottom plate of cell capacitor 240-b, for example.

In some cases, a first node 455 of each local capacitor 475 may be coupled with node 435-a (e.g., by activating corresponding switching components 470) at a time period when sense amplifier 405-a is inactive. During this time period, switching components 705-a, 705-b, 705-c may be deactivated; e.g., they may be open. Thus, local capacitors 475 may develop a voltage across local capacitors 475 that may be the difference between the voltage at node 435-a (e.g., the global VCASC) and the voltage supplied by voltage sources 460-a (e.g., Vplate).

At a first time, switching component 470-a may be deactivated, causing local capacitor 475-a to be decoupled from node 435-a and store a first difference between the voltage at node 435-a and the voltage supplied by voltage source 460-a.

At a second time (e.g., after the first time), switching component 470-b may be deactivated, causing local capacitor 475-b to be decoupled from node 435-a and store a second voltage difference between the voltage at node 435-a and the voltage supplied by voltage source 460-a. The second voltage difference may be different than the first voltage difference (e.g., as stored by local capacitor 475-a) due to transient changes in VCASC, Vplate, or both.

At a third time (e.g., after the second time), switching component 470-c may be deactivated, causing local capacitor 475-c to be decoupled from node 435-a and store a third difference between the voltage at node 435-a and the voltage supplied by voltage source 460-a. This third voltage difference may be different than the first and/or second voltage differences stored by local capacitors 475-a and 475-b, respectively, due to changes in the transient voltages of VCASC, Vplate, or both.

At a fourth time (e.g., after the third time), local capacitors 475-a, 475-b, 475-c may be coupled with node 480-a by activating corresponding switching components 705-a, 705-b, 705-c. Node 480-a may be located at a gate 490-a of switching component 485-a, for example. When switching components 705 are activated, the set of local capacitors 475 may share charge with each other, thereby providing a moving average VCASC voltage (e.g., an average of the voltage differences stored by the local capacitors 475 at the first time, the second time, and the third time) to node 480-a.

After switching components 705 are activated, sense amplifier 405-a may be activated to determine a state stored by memory cell 205-b, for example. Because the first node 455 of each of the local capacitors 475 are decoupled from node 435-a, and are therefore floating during this critical portion of the read operation, the voltage at node 480-a may track changes in the voltage of the plate line (Vplate) and provide a more stable read voltage across memory cell 205-b when or while, e.g., the sense amplifier 405-a is activated.

Although memory device 700 depicts three local capacitors (475-a, 475-b, 475-c) and corresponding switching components (470-a, 470-b, 470-c, 705-a, 705-b, 705-c), it should be appreciated that a memory device may use more or fewer local capacitors and switching components without departing from the scope of the disclosure.

Optionally, memory device 700 may include an additional local capacitor 710 that may be used to store the moving average voltage provided by local capacitors 475 and provide the moving average voltage to node 480-a.

In some cases, it may be desirable to weight the voltage differences stored by local capacitors 475 differently for the moving average voltage. For example, the voltage difference stored at a later time (e.g., the voltage difference stored by local capacitor 475-c at the third time) may be more relevant to maintaining a stable read voltage than the voltage difference stored at an earlier time (e.g., the voltage difference stored by local capacitor 475-a at the first time). Because a bigger capacitor may have a larger relative effect on the overall average voltage when all the capacitors are coupled together, a bigger capacitor may be used to store the voltage difference at the time that is most relevant (for example, at the last time the voltage difference is sampled).

Thus, in some cases, each local capacitor 475 may have a different capacitance depending on the desired weighting of the voltage difference stored by the local capacitor 475. As one example, local capacitor 475-a may have a smaller capacitance than local capacitor 475-b, which may in turn have a smaller capacitance than local capacitor 475-c. Other combinations of sizes are also possible.

Additional details regarding the timing and operation of the moving average circuitry (e.g., including the set of local capacitors 475 and corresponding switching components) of memory device 700 are discussed with reference to FIGS. 8 and 9.

Figure 8:
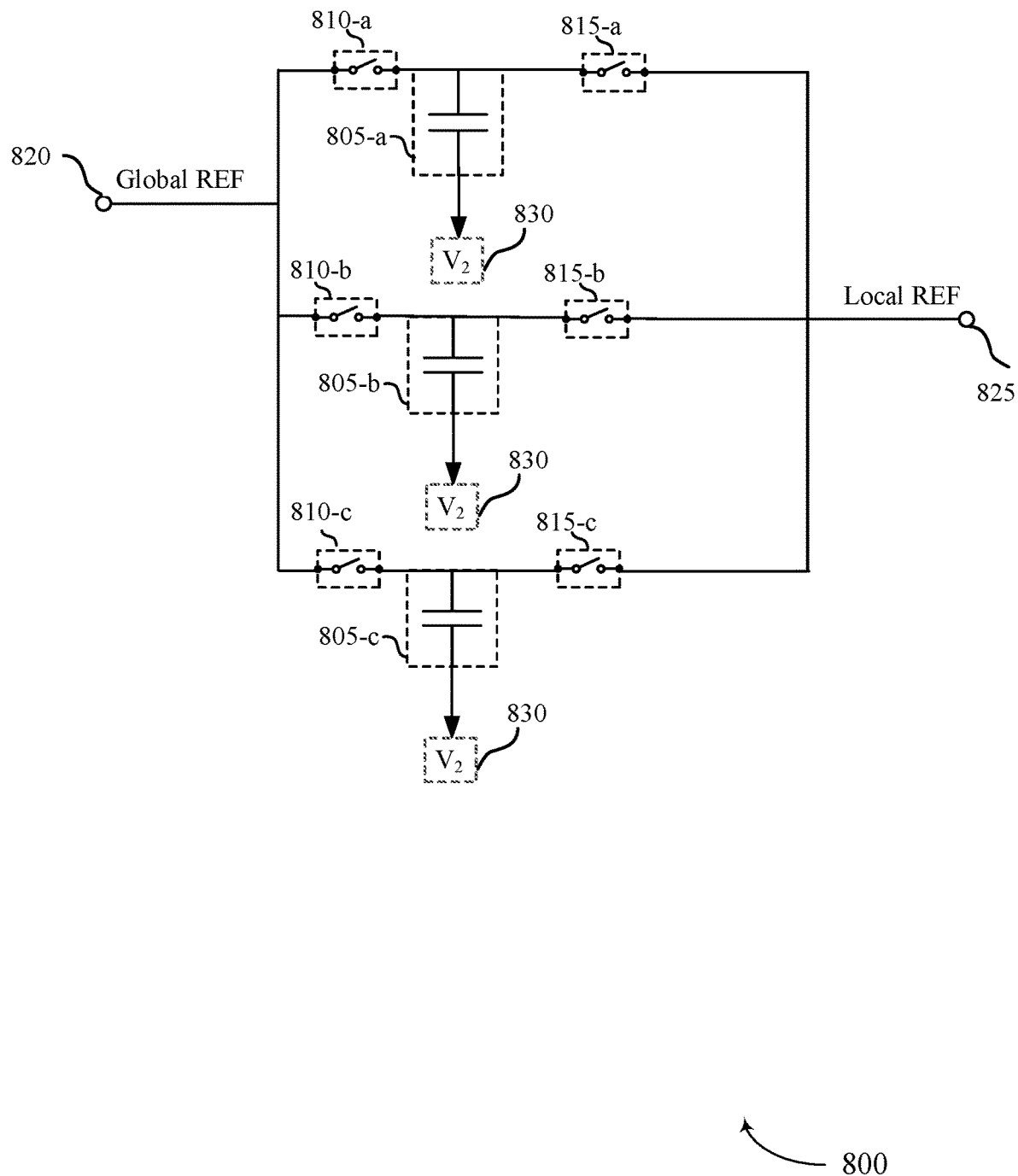
FIG. 8 illustrates an example of a circuit that supports reference voltage management in accordance with examples as disclosed herein.

FIG. 8 illustrates an example of a circuit 800 that supports reference voltage management in accordance with examples as disclosed herein. Circuit 800 may be referred to as a moving average circuit, and may be similar to the moving average circuitry depicted in memory device 700, but may be used in the more general case of maintaining a stable voltage difference ($\Delta V$) between a general reference signal (e.g., a local reference signal) and another voltage (e.g., a VSS voltage or ground voltage) during a critical operation using techniques similar to those described with reference to FIG. 7. Such a reference signal may include, for example, a reference voltage used by a sense amplifier to determine a state stored by a memory cell as described with reference to FIG. 2, or may be another type of reference signal. The critical operation may be an operation during which it is important to maintain a stable difference between the local reference signal and the second voltage, for example.

Circuit 800 may include a set of multiple local capacitors 805. The local capacitors 805 may be used to sample and store the voltage difference between a global reference voltage (Global REF) at node 820 and a second voltage (e.g., a voltage supplied by voltage source 830) at different times before a critical operation is performed. The local capacitors 805 may be used to provide a moving average voltage difference to node 825, which may provide a local reference signal (Local REF) to other circuitry in a memory device, such as to a sense component.

As described with respect to the circuitry in memory device 700, each local capacitor 805 may be selectively coupled with node 820 by activating a corresponding switching component 810. In some cases, a first node of each local capacitor 805 may be selectively coupled with node 820 and a second node of each local capacitor 805 may be coupled with a voltage source 830, for example.

In some cases, local capacitors 805 may be coupled with node 820 (e.g., by activating corresponding switching components 810) at a time period when before the critical operation, when the circuitry is relatively quiet. During this time period, switching components 815-a, 815-b, 815-c may be deactivated; e.g., they may be open. Thus, local capacitors 805 may develop a voltage across local capacitors 805 that may be the voltage difference $\Delta V$ between the voltage at node 820 and the voltage supplied by voltage sources 830.

At a first time, switching component 810-a may be deactivated, causing local capacitor 805-a to be decoupled from node 820 and store a first voltage difference between the voltage at node 820 and the voltage supplied by voltage source 830.

At a second time (e.g., after the first time), switching component 810-b may be deactivated, causing local capacitor 805-b to be decoupled from node 820 and store a second voltage difference between the voltage at node 820 and the voltage supplied by voltage source 830. The second voltage difference may be different than the first voltage difference (e.g., as stored by local capacitor 805-a) due to transient changes in the global reference voltage at node 820, the local voltage as supplied by voltage source 830, or both.

At a third time (e.g., after the second time), switching component 810-c may be deactivated, causing local capacitor 805-c to be decoupled from node 820 and store a third difference between the voltage at node 820 and the voltage supplied by voltage source 830. This third voltage difference may be different than the first and/or second voltage differences stored by local capacitors 805-a and 805-b, respectively, due to transient changes in the global reference voltage at node 820, the local voltage as supplied by voltage source 830, or both.

At a fourth time (e.g., after the third time), local capacitors 805-a, 805-b, 805-c may be coupled with node 825 and with each other by activating corresponding switching components 815-a, 815-b, 815-c. Node 825 may provide a local reference signal (Local REF) to other circuitry in the memory device, such as to a sense component. When switching components 815 are activated, local capacitors 805 may share charge with each other, thereby providing a moving average of the voltage differences stored at the first time, the second time, and the third time to node 825. Because node 825 is floating, the voltage at node 825 may track voltage changes of the local voltage supplied by voltage source 830, thereby providing a stable voltage difference (e.g., a stable Local REF) at node 825.

After switching components 815 are activated, and node 825 is allowed to float, the critical operation may be performed. In some cases, during the critical operation, the voltage difference $\Delta V$ between the local reference signal at node 825 and the voltage supplied by voltage source 830 may remain relatively stable because the voltage at node 825 may track, by way of local capacitors 805, voltage changes associated with voltage sources 830.

In some cases, after the critical operation is performed, local capacitors 805 may be decoupled from node 825 (e.g., by deactivating switching components 815) and recoupled with node 820 (e.g., by activating switching components 810) to prepare for the next critical operation, for example.

Other aspects of the operation of circuit 800, which may be a general case of circuitry depicted in memory device 700, are described in more detail with reference to FIG. 9.

Figure 9:
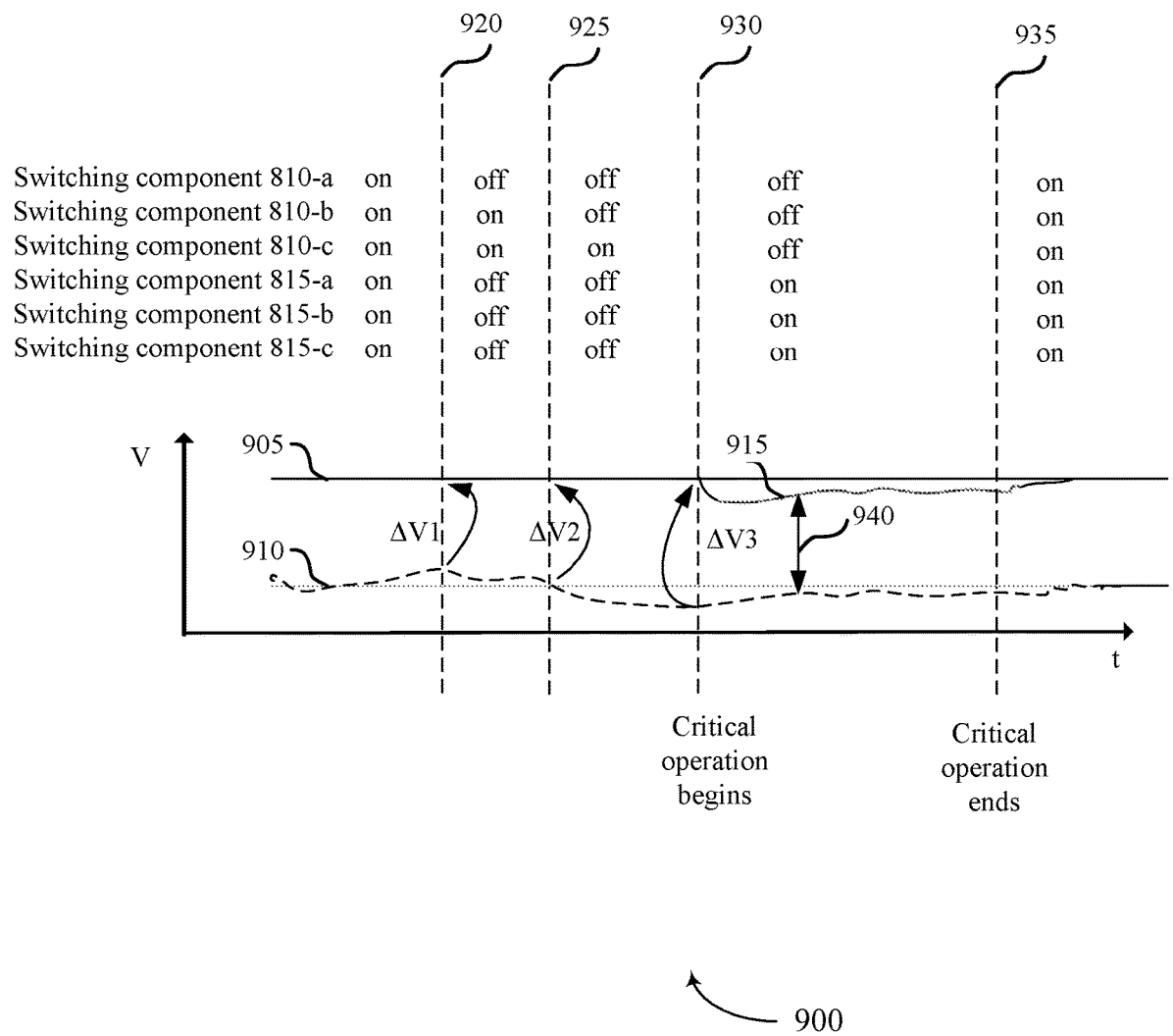
FIG. 9 illustrates an example of a timing diagram that supports reference voltage management in accordance with examples as disclosed herein.

FIG. 9 illustrates an example of a timing diagram 900 of voltages that may occur during various operations in a memory device that supports reference voltage management in accordance with examples as disclosed here.

As previously discussed, in some cases, it may be desirable to maintain a stable voltage difference ΔV between a local reference voltage and another voltage (e.g., a VSS voltage, ground voltage or other voltage) during certain critical operations. Such critical operations may include sensing operations during a read operation of a memory cell, for example, or other critical operations during which the stability of a voltage difference ΔV may be desirable.

Timing diagram 900 depicts various voltages associated with circuit 800 during operation of a memory device that may include circuit 800.

Timing diagram 900 may include global reference voltage 905, which may be a voltage associated with node 820 of circuit 800, for example (e.g., Global REF). That is, in some cases, node 820 may be biased to global reference voltage 905, which may be a reference voltage for a sense operation or a VCASC voltage, for example.

Timing diagram may include local supply voltage 910, which may be a voltage associated with a voltage supply 830. That is, in some cases, local supply voltage 910 may be supplied by voltage supply 830 but may experience variations based on various electrical effects in a memory device, such as when electrical current is injected by an activated sense amplifier, for example. Local supply voltage 910 may be (or may be based on) a VSS voltage or a plate line voltage (Vplate) supplied by voltage supply 830, for example.

Timing diagram 900 may include local reference voltage 915, which may be a voltage at node 825 of circuit 800 (e.g., Local REF). In some cases, local reference voltage 915 may be a reference voltage used by a sense amplifier to determine a state stored by a memory cell, or may be a gate voltage (e.g., a voltage at a gate of a cascode amplifier) that is used to bias a voltage of memory cell, for example. The voltages depicted in timing diagram 900 are approximate and are intended to illustrate general electrical behavior rather than specific voltages.

Before time 920, switching components 810 and 815 may be activated (e.g., turned "on"). Thus, local reference voltage 915 may be substantially equal to global reference voltage 905 (and therefore may not be visible in timing diagram 900) because node 825 is coupled with node 820. The voltage across each of local capacitors 805 may be the difference between the global reference voltage 905 and the local supply voltage 910 (which may differ somewhat from the voltage of voltage supply 830, due to various transient or parasitic effects in the memory device).

At time 920, switching components 815 may be deactivated (e.g., turned "off") to decouple each of local capacitors 805 from node 825 (e.g., from the local reference voltage 915). In addition, switching component 810-a may be deactivated to decouple local capacitor 805-a from node 820 (e.g., from the global reference voltage 905). Thus, at time 920, local capacitor 805-a may store a first voltage difference ΔV1 between the global reference voltage 905 at node 820 and the local supply voltage 910. At time 920, local capacitors 805-b and 805-c may remain coupled with node 820; that is, switching components 810-b, 810-c may remain turned "on."

At time 925, switching component 810-b may be deactivated to decouple local capacitor 805-b from node 820 (e.g., the global reference voltage 905). Thus, at time 925, local capacitor 805-b may store a second voltage difference ΔV2 between the global reference voltage 905 at node 820 and the local supply voltage 910. At time 925, local capacitor 805-c may remain coupled with node 820; that is, switching component 810-c may remain turned "on."

At time 930, switching component 810-c may be deactivated to decouple local capacitor 805-c from node 820 (e.g., the global reference voltage 905). Thus, at time 930, local capacitor 805-c may store a third voltage difference ΔV3 between the global reference voltage 905 at node 820 and the local supply voltage 910.

Also at (or near) time 930, switching components 815 may be activated (turned "on") such that local capacitors 805 may be coupled with each other and with node 825, and may begin sharing charge. Thus, the voltage at node 825 (e.g., the local reference voltage 915) may be biased to a voltage such that the voltage difference between local reference voltage 915 and local supply voltage 910 is an average of the voltage differences ΔV1, ΔV2, ΔV3 across local capacitors 805. Such an average may be considered a moving average because ΔV1, ΔV2, ΔV3 were each stored at different times.

As previously discussed, in some cases, the sizes of local capacitors 805 may be different, such that the voltage at node 825 may provide a weighted average of the voltage differences ΔV1, ΔV2, ΔV3 across local capacitors 805.

At (or after) time 930, the critical operation (e.g., an active phase) may begin. The critical operation may include, for example, activation of a sense amplifier to sense a voltage on a digit line during a read operation of a memory cell, for example. The critical operation may be based on (e.g., may use or rely on) the voltage difference 940 between the local reference voltage 915 and the local supply voltage 910, for example.

During the critical operation (which may occur between time 930 and time 935), the voltage difference 940 between the local reference voltage 915 and the local supply voltage 910 may remain relatively stable even though the local supply voltage 910 may vary, because the local capacitors 805 are decoupled from the global reference voltage 905; e.g., they are floating, thereby enabling the voltage at node 825 (e.g., local reference voltage 915) to track changes in the voltage of the local supply voltage 910 and maintain a stable voltage difference 940.

At time 935, the critical operation may end. At or after time 935, switching components 810 (and possibly 815) may be re-activated to prepare for the next operation by re-coupling local capacitors 805 with node 820.

Figure 10:
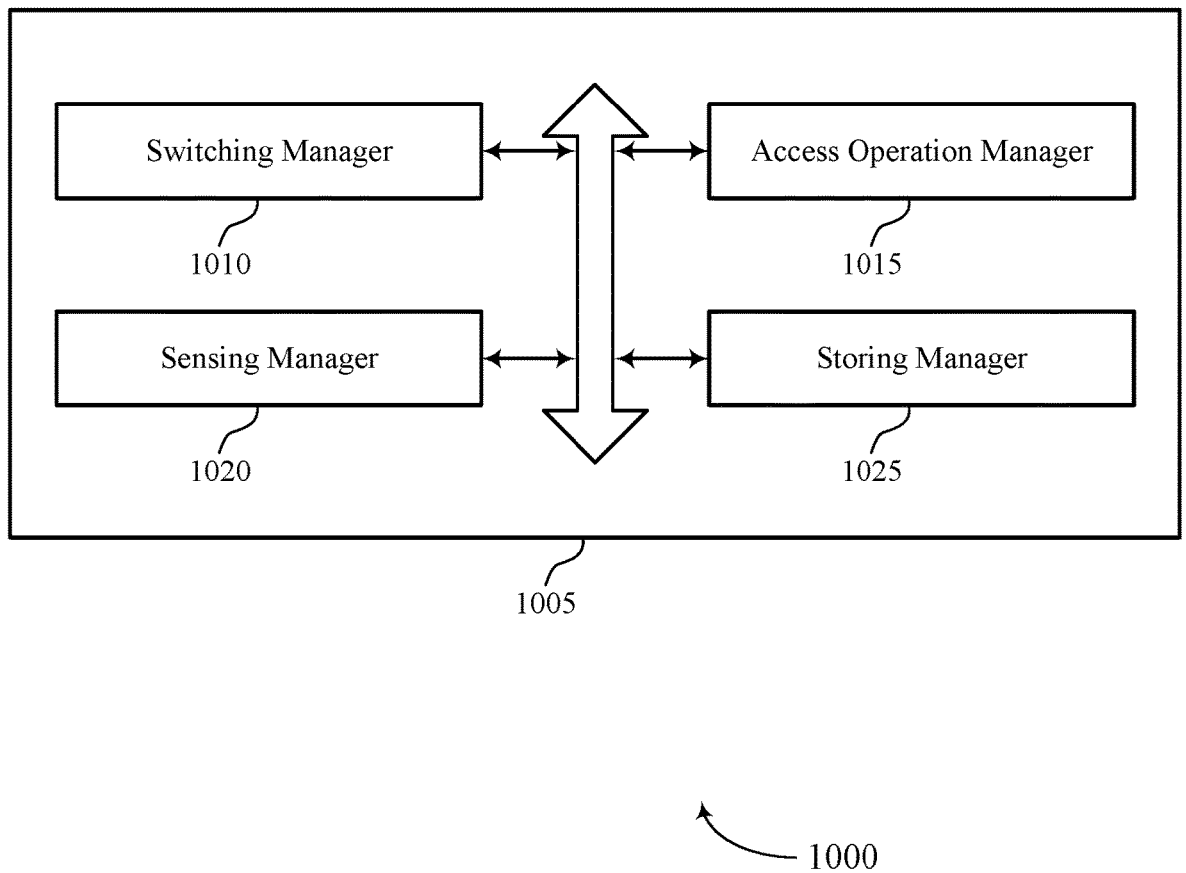
FIG. 10 illustrates a block diagram of a memory controller that supports reference voltage management in accordance with examples as disclosed herein.

FIG. 10 shows a block diagram 1000 of a controller 1005 that supports reference voltage management in accordance with examples as disclosed herein. The controller 1005 may be an example of features of a local memory controller, device memory controller, or external memory controller of a memory device as described with reference to FIGS. 1 and 2. The controller 1005 may include a switching manager 1010, an access operation manager 1015, a sensing manager 1020, and a storing manager 1025. Each of these modules may communicate, directly or indirectly, with one another (e.g., via one or more buses, conductive lines, etc.).

The switching manager 1010 may couple a first capacitor with a first node biased to a first voltage. The first capacitor may be coupled with a second node associated with establishing a conductive path between a digit line of a memory cell and a sense component.

In some examples, the switching manager 1010 may decouple the first capacitor from the first node; e.g., before accessing a memory cell and performing a critical operation. In some examples, the switching manager 1010 may couple (e.g., re-couple) the first capacitor with the first node after accessing the memory cell.

In such examples, the switching manager 1010 may couple a first capacitor and a second capacitor with a first node biased to a first voltage. The switching manager 1010 may decouple, at a first time, the first capacitor from the first node to store a first representation of a difference between the first voltage and a second voltage associated with a plate line of a memory cell. The switching manager 1010 may decouple, at a second time after the first time, the second capacitor from the first node to store a second representation of the difference between the first voltage and the second voltage. The switching manager 1010 may couple, at a third time after the second time, the first capacitor and the second capacitor with a second node associated with establishing a conductive path between a digit line of the memory cell and a sense component.

The switching manager 1010 may couple the first capacitor with the first node by activating a switching component. The switching manager 1010 may decouple the first capacitor from the first node by deactivating a switching component. The switching manager 1010 may decouple the first capacitor from the first node by adjusting (e.g., increasing) a resistance associated with the switching component. In some cases, coupling the first capacitor with the first node couples the first capacitor with a second capacitor, where the second capacitor is coupled between the first node and a voltage supply providing the first voltage.

The switching manager 1010 may couple the first capacitor and the second capacitor with a third capacitor that is coupled with the second node.

In some cases, the first capacitor is coupled with the first node at a time when the sense component is inactive. In some cases, the first capacitor is coupled with a gate of a cascode amplifier. In some cases, the first capacitor and second capacitor are coupled with a second voltage supply configured to supply the second voltage.

The access operation manager 1015 may access the memory cell after the first capacitor is decoupled from the first node. In some examples, the access operation manager 1015 may access the memory cell while the first capacitor and second capacitor are coupled with the second node. In some examples, access operation manager 1015 may access the memory cell by asserting a word line signal associated with the memory cell.

The storing manager 1025 may store, using the first capacitor, a voltage difference between the first voltage and a second voltage associated with a plate line of the memory cell.

The sensing manager 1020 may sense, while the first capacitor is decoupled from the first node, the state stored by the memory cell using the sense component.

Figure 11:
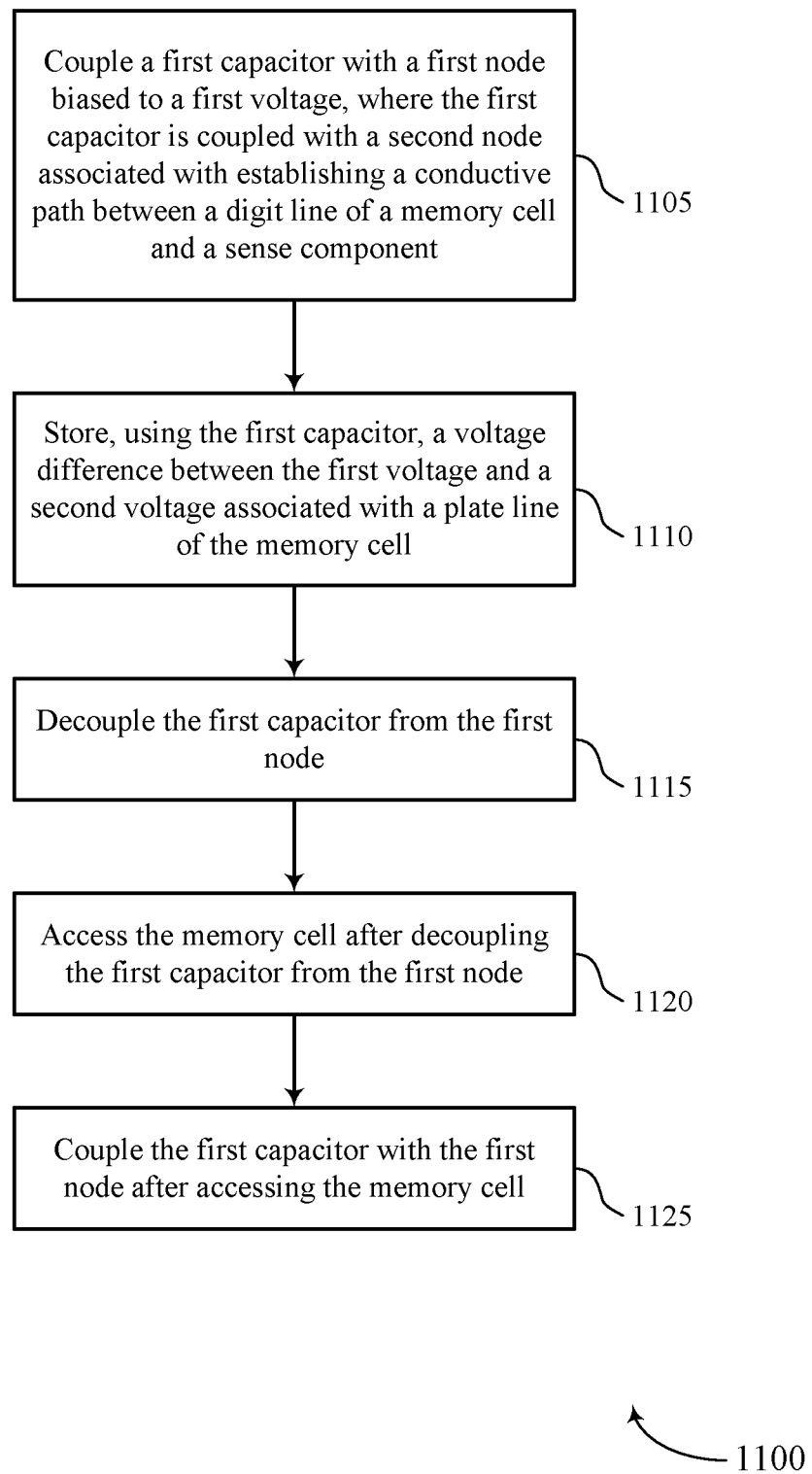
FIG. 11 illustrates a method that supports reference voltage management in accordance with examples as disclosed herein.

FIG. 11 shows a flowchart illustrating a method or methods 1100 that supports reference voltage management in accordance with examples as disclosed herein. The operations of method 1100 may be implemented by a memory device or its components as described herein. For example, the operations of method 1100 may be performed by a memory device as described with reference to FIG. 1. In some examples, a memory device may execute a set of instructions to control the functional elements of the memory device to perform the described functions. Additionally or alternatively, a memory device may perform aspects of the described functions using special-purpose hardware.

At 1105, the memory device may couple a first capacitor with a first node biased to a first voltage. The first capacitor may be coupled with a second node associated with establishing a conductive path between a digit line of a memory cell and a sense component. The operations of 1105 may be performed according to the methods described herein. In some examples, aspects of the operations of 1105 may be performed by a switching manager as described with reference to FIG. 10.

At 1110, the memory device may store a voltage difference between the first voltage and a second voltage associated with a plate line of the memory cell using the first capacitor. The operations of 1110 may be performed according to the methods described herein. In some examples, aspects of the operations of 1110 may be performed by a storing manager as described with reference to FIG. 10.

At 1115, the memory device may decouple the first capacitor from the first node. The operations of 1115 may be performed according to the methods described herein. In some examples, aspects of the operations of 1115 may be performed by a switching manager as described with reference to FIG. 10.

At 1120, the memory device may access the memory cell after decoupling the first capacitor from the first node. The operations of 1120 may be performed according to the methods described herein. In some examples, features of the operations of 1120 may be performed by an access operation manager as described with reference to FIG. 10.

At 1125, the memory device may couple the first capacitor with the first node after accessing the memory cell. The operations of 1125 may be performed according to the methods described herein. In some examples, features of the operations of 1125 may be performed by a switching manager as described with reference to FIG. 10.

In some examples, an apparatus as described herein may perform a method or methods, such as the method 1100. The apparatus may include features, means, or instructions (e.g., a non-transitory computer-readable medium storing instructions executable by a processor) for coupling a first capacitor with a first node biased to a first voltage, where the first capacitor is coupled with a second node associated with establishing a conductive path between a digit line of a memory cell and a sense component. The apparatus may include features, means, or instructions for storing, using the first capacitor, a voltage difference between the first voltage and a second voltage associated with a plate line of the memory cell, decoupling the first capacitor from the first node, accessing the memory cell after decoupling the first capacitor from the first node, and coupling the first capacitor with the first node after accessing the memory cell.

Some examples of the method 1100 and the apparatus described herein may further include operations, features, means, or instructions for sensing, while the first capacitor is decoupled from the first node, the state stored by the memory cell using the sense component.

In some examples of the method 1100 and the apparatus described herein, coupling the first capacitor with the first node may include operations, features, means, or instructions for activating a switching component.

In some examples of the method 1100 and the apparatus described herein, decoupling the first capacitor from the first node may include operations, features, means, or instructions for deactivating a switching component.

In some examples of the method 1100 and the apparatus described herein, decoupling the first capacitor from the first node may include operations, features, means, or instructions for increasing a resistance associated with the switching component.

In some examples of the method 1100 and the apparatus described herein, the first capacitor may be coupled with the first node at a time when the sense component may be inactive.

In some examples of the method 1100 and the apparatus described herein, the first capacitor may be coupled with a gate of the cascode amplifier.

Some examples of the method 1100 and the apparatus described herein may further include operations, features, means, or instructions for coupling the first capacitor with the first node couples the first capacitor with a second capacitor, where the second capacitor may be coupled between the first node and a voltage supply providing the first voltage.

In some examples of the method 1100 and the apparatus described herein, accessing the memory cell may include operations, features, means, or instructions for asserting a word line signal associated with the memory cell.

Figure 12:
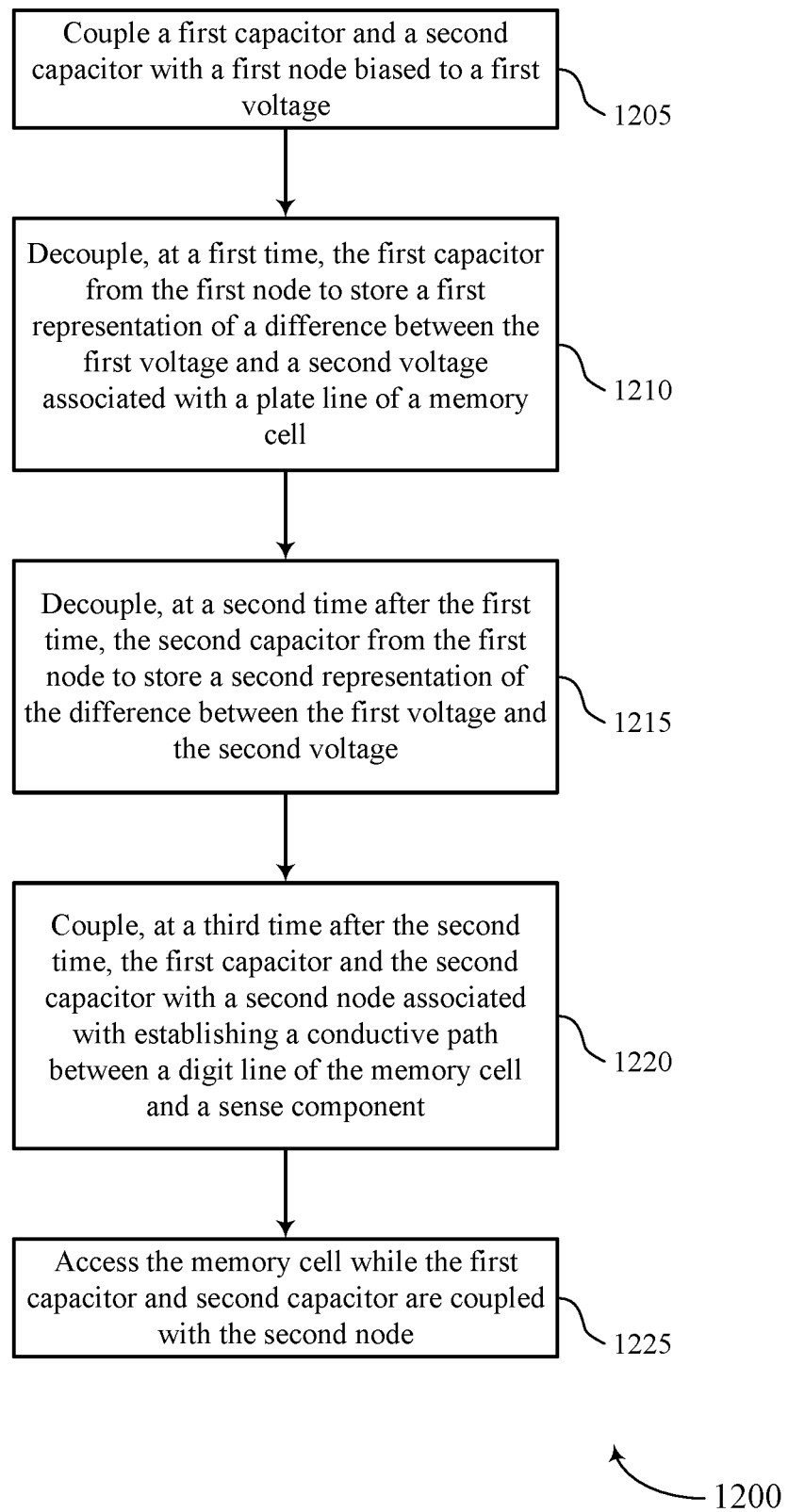
FIG. 12 illustrates a method that supports reference voltage management in accordance with examples as disclosed herein.

FIG. 12 shows a flowchart illustrating a method or methods 1200 that supports reference voltage management in accordance with features of the present disclosure. The operations of method 1200 may be implemented by a memory device or its components as described herein. For example, the operations of method 1200 may be performed by a memory device as described with reference to FIG. 1. In some examples, a memory device may execute a set of instructions to control the functional elements of the memory device to perform the described functions. Additionally or alternatively, a memory device may perform features of the described functions using special-purpose hardware.

At 1205, the memory device may couple a first capacitor and a second capacitor with a first node biased to a first voltage. The operations of 1205 may be performed according to the methods described herein. In some examples, features of the operations of 1205 may be performed by a switching manager as described with reference to FIG. 10.

At 1210, the memory device may decouple, at a first time, the first capacitor from the first node to store a first representation of a difference between the first voltage and a second voltage associated with a plate line of a memory cell. The operations of 1210 may be performed according to the methods described herein. In some examples, features of the operations of 1210 may be performed by a switching manager as described with reference to FIG. 10.

At 1215, the memory device may decouple, at a second time after the first time, the second capacitor from the first node to store a second representation of the difference between the first voltage and the second voltage. The operations of 1215 may be performed according to the methods described herein. In some examples, features of the operations of 1215 may be performed by a switching manager as described with reference to FIG. 10.

At 1220, the memory device may couple, at a third time after the second time, the first capacitor and the second capacitor with a second node associated with establishing a conductive path between a digit line of the memory cell and a sense component. The operations of 1220 may be performed according to the methods described herein. In some examples, features of the operations of 1220 may be performed by a switching manager as described with reference to FIG. 10.

At 1225, the memory device may access the memory cell while the first capacitor and second capacitor are coupled with the second node. The operations of 1225 may be performed according to the methods described herein. In some examples, features of the operations of 1225 may be performed by an access operation manager as described with reference to FIG. 10.

In some examples, an apparatus as described herein may perform a method or methods, such as the method 1200. The apparatus may include features, means, or instructions (e.g., a non-transitory computer-readable medium storing instructions executable by a processor) for coupling a first capacitor and a second capacitor with a first node biased to a first voltage, decoupling, at a first time, the first capacitor from the first node to store a first representation of a difference between the first voltage and a second voltage associated with a plate line of a memory cell, decoupling, at a second time after the first time, the second capacitor from the first node to store a second representation of the difference between the first voltage and the second voltage, coupling, at a third time after the second time, the first capacitor and the second capacitor with a second node associated with establishing a conductive path between a digit line of the memory cell and a sense component, and accessing the memory cell while the first capacitor and second capacitor are coupled with the second node.

In some examples of the method 1200 and the apparatus described herein, coupling the first capacitor and the second capacitor with the second node may include operations, features, means, or instructions for coupling the first capacitor and the second capacitor with a third capacitor that may be coupled with the second node.

In some examples of the method 1200 and the apparatus described herein, the first capacitor and second capacitor may be coupled with a second voltage supply configured to supply the second voltage.

It should be noted that the methods described above describe possible implementations, and that the operations and the steps may be rearranged or otherwise modified and that other implementations are possible. Furthermore, features from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components.

At any given time, the conductive path between components that are in electronic communication with each other (or in conductive contact with or connected with or coupled with) may be an open circuit or a closed circuit based on the operation of the device that may include the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
storing in each storage device of a plurality of storage devices at correspondingly different times, respective voltage differences between a first voltage and a second voltage associated with a plate line of a memory cell;
providing, to a switching component, a moving average of a voltage difference between the first voltage and the second voltage, based at least in part on the respective voltage differences stored in the plurality of storage devices; and
establishing a conductive path between a digit line of the memory cell and a sense component based at least in part on providing the moving average of the voltage difference to the switching component.

2. The method of claim 1, wherein the respective voltage differences are weighted with respect to each other.

3. The method of claim 2, wherein respective weights of the respective voltage differences are based on respective capacitances of the plurality of storage devices.

4. The method of claim 1, further comprising:
storing the moving average of the voltage difference in a second storage device.

5. The method of claim 1, wherein providing to the switching component the moving average of the voltage difference comprises:
coupling the plurality of storage devices with each other and with the switching component.

6. The method of claim 1, wherein storing in each storage device the respective voltage differences at different times comprises:
coupling the plurality of storage devices with a first node biased to the first voltage, comprising activating respective second switching components corresponding to the plurality of storage devices; and
decoupling the plurality of storage devices from the first node at different times, comprising deactivating, at respective different times associated with the plurality of storage devices, the respective second switching components corresponding to the plurality of storage devices.

7. The method of claim 6, wherein providing to the switching component the moving average of the voltage difference comprises:
coupling, after the decoupling the plurality of storage devices from the first node at the different times, the plurality of storage devices with a second node that is coupled with the switching component, comprising activating respective third switching components corresponding to the plurality of storage devices.

8. A method, comprising:
coupling a plurality of capacitors with a first node, wherein the first node is biased to a first voltage;
decoupling the plurality of capacitors from the first node at different times to store in each capacitor respective differences between the first voltage and a second voltage associated with a plate line of a memory cell;
coupling, after the plurality of capacitors have been decoupled from the first node, the plurality of capacitors with a second node associated with establishing a conductive path between a digit line of the memory cell and a sense component such that the plurality of capacitors are concurrently coupled with the second node; and
accessing the memory cell based at least in part on the coupling of the plurality of capacitors with the second node.

9. The method of claim 8, wherein the respective differences stored in the plurality of capacitors correspond to the respective decoupling times of the plurality of capacitors.

10. The method of claim 8, wherein the respective differences are weighted with respect to each other based on respective capacitances of the plurality of capacitors.

11. The method of claim 8, wherein coupling the plurality of capacitors with the first node comprises:
activating respective second switching components corresponding to the plurality of capacitors.

12. The method of claim 11, wherein decoupling the plurality of capacitors from the first node at different times comprises:
deactivating, at respective different times associated with the plurality of capacitors, the respective second switching components corresponding to the plurality of capacitors.

13. The method of claim 8, wherein coupling the plurality of capacitors with the second node comprises:
activating respective third switching components corresponding to the plurality of capacitors.

14. A memory device, comprising:
a memory cell;
a switching component coupled to the memory cell;
a sense component coupled to the switching component;
a plurality of storage devices; and
a controller configured to cause the memory device to:
store in each of the plurality of storage devices at correspondingly different times, respective voltage differences between a first voltage and a second voltage associated with a plate line of the memory cell;
provide, to the switching component, a moving average of a voltage difference between the first voltage and the second voltage, based at least in part on the respective voltage differences stored in the plurality of storage devices; and
establish a conductive path between a digit line of the memory cell and the sense component based at least in part on providing the moving average of the voltage difference to the switching component.

15. The memory device of claim 14, wherein the plurality of storage devices comprises:
a plurality of capacitors.

16. The memory device of claim 15, wherein the respective voltage differences are weighted based on respective capacitances of the plurality of capacitors.

17. The memory device of claim 14, further comprising:
a second storage device;
wherein the controller is further configured to cause the memory device to:
store the moving average of the voltage difference in the second storage device.

18. The memory device of claim 14, wherein to provide to the switching component the moving average of the voltage difference, the controller is further configured to cause the memory device to:
couple the plurality of storage devices with each other and with the switching component.

19. The memory device of claim 14, further comprising:
a plurality of second switching components corresponding to the plurality of storage devices;
wherein to store in each storage device the respective voltage differences at different times, the controller is further configured to cause the memory device to:
couple the plurality of storage devices with a first node biased to the first voltage, comprising activating the plurality of second switching components respectively corresponding to the plurality of storage devices; and
decouple the plurality of storage devices from the first node at different times, comprising deactivating, at respective different times associated with the plurality of storage devices, the respective second switching components corresponding to the plurality of storage devices.

20. The memory device of claim 19, further comprising:
a plurality of third switching components respectively corresponding to the plurality of storage devices;
wherein to provide to the switching component the moving average of the voltage difference, the controller is further configured to cause the memory device to:
couple, after the decoupling of the plurality of storage devices from the first node at the different times, the plurality of storage devices with a second node that is coupled with the switching component, comprising activating the plurality of third switching components.

* * * * *